DIFFERENTIAL AMPLIFIER

Filed Aug. 18, 1967 2 Sheets-Sheet 1

INVENTOR
R. V. GOORDMAN
BY Kenneth B Hamlin
ATTORNEY

United States Patent Office 3,497,824

Patented Feb. 24, 1970

3,497,824

DIFFERENTIAL AMPLIFIER

Robert V. Goordman, Hackettstown, N.J., assignor to Bell Telephone Laboratories, Incorporated, Murray Hill, N.J., a corporation of New York Filed Aug. 18, 1967, Ser. No. 661,714
Int. Cl. H03f 3/68
U.S. Cl. 330—30 12 Claims

ABSTRACT OF THE DISCLOSURE

A differential amplifier with a high common-mode rejection ratio across a wide bandwidth is developed by combining an emitter-coupled differential amplifier with an emitter-follower amplifier. In response to the differential amplifier input signals, the emitter-follower amplifier supplies an essentially constant total emitter current required by the differential amplifier for suppressing common-mode input signals.

A differential bridge amplifier including two differential amplifier stages, arranged in accordance with the invention, has a high common-mode rejection ratio with respect to both input signals and ambient temperature-induced signal variations.

BACKGROUND OF THE INVENTION

Field of the invention

The invention is a differential amplifier that is more particularly described as an emitter-coupled differential amplifier stage having an emitter-follower current source.

Description of the prior art

Conventional emitter-coupled differential amplifier stages are used in small signal applications for enhancing differential-mode signals relative to common-mode signals. Performance of one differential amplifier with respect to another differential amplifier is determined by a common-mode rejection ratio (C.M.R.), which is the ratio of difference-mode gain $R_d$ to common-mode gain $A_c$. Desirable common-mode rejection ratios have high values, and poor common-mode rejection ratios have low values. In accordance with the ratio, one way to achieve high values of C.M.R. is by reducing the common-mode gain, or suppressing common-mode signals, in the amplifier.

Either a single-biasing resistor $R_{EE}$ or a transistor collector circuit, constant-current source usually is connected to a common junction in the emitter circuits of a matched pair of transistors in a conventional emitter-coupled differential amplifier. For perfect common-mode rejection, the total bias current through the common junction in the emitter circuit remains constant, but common-mode signals which reduce the common-mode rejection ratio to lower values are manifested in part by changes of the total bias current through the common junction. In such conventional differential amplifiers, the common-mode component of emitter voltage on the common junction can cause current changes through the junction of substantial magnitude with respect to the differential-mode signal current. Such current changes through the common junction are sufficient to substantially reduce the common-mode rejection ratio.

When a practical combination of an emitter-biasing resistor $R_{EE}$ and potential source is used as the current source, the differential amplifier has a modest common-mode rejection ratio and a wide C.M.R. bandwidth. The emitter circuit impedance $Z_{EE}$ (resistor $R_{EE}$ plus its distributed capacitance) produces at the emitter circuit junction common-mode signal currents which are approximately equal to common-mode input signal voltage divided by the impedance $Z_{EE}$ and are responsible for limiting C.M.R. to the modest value. This modest C.M.R. is relatively level for all frequencies from D.C. up into the megacycle range where the C.M.R. falls off from the level value to a half power point and further.

When a practical transistor collector circuit is used as the current source, the differential amplifier has a high C.M.R. but narrow C.M.R. bandwidth. The C.M.R. is high for low frequencies because the collector circuit presents a high impedance $Z_{EE}$ at the low frequencies, however, base-collector junction capacitance reactance begins to predominate the impedance $Z_{EE}$ at frequencies of approximately a kilocycle. Therefore at frequencies greater than a kilocycle, the C.M.R. falls off to its half power point and continues to fall as frequency increases.

Conventional differential amplifiers using either the emitter-biasing resistor and potential source or the collector circuit of a transistor as their current sources are unable to produce a high common-mode rejection ratio which extends over a bandwidth from D.C. up into the megacycle range.

SUMMARY OF THE INVENTION

An object of the invention is to improve the common-mode rejection ratio characteristic of an emitter-coupled differential amplifier.

Another object is to increase the C.M.R. bandwidth of a differential amplifier having a high common-mode rejection ratio.

These and other objects of the invention are realized in an illustrative embodiment thereof in which an emitter-coupled differential amplifier is combined with an emitter-follower amplifier current source. An emitter-circuit resistor couples an emitter electrode of the emitter-follower to a common junction in the emitter circuit of the differential amplifier. Inputs to the amplifiers are coupled together by means of a low impedance network. Input signals are thereby applied to base electrodes in the differential amplifier and through the low impedance network to a base electrode in the emitter-follower. Common-mode output signals are substantially suppressed by the invention because the emitter-follower supplies an essentially constant total emitter current to the differential amplifier regardless of common-mode components in input signals. This suppression of the common-mode output signals improves the common-mode rejection ratio and increases the useful C.M.R. bandwidth of the differential amplifier.

A feature of the invention is a coupling of an emitter-follower amplifier to a common junction in the emitter circuit of an emitter-coupled differential amplifier.

Another feature is the coupling of differential amplifier input signals through a low impedance transmission path to the input of the emitter-follower for controlling conduction through the emitter circuit of the emitter-follower.

A further feature is the coupling of two emitter-follower amplifiers to a common junction in the emitter circuit of an emitter-coupled differential amplifier so that impedance loading, or cross coupling, can be minimized between the inputs of the differential amplifier.

A still further feature is a coupling of two differential amplifier stages, arranged in accordance with the invention, as a differential bridge amplifier.

BRIEF DESCRIPTION OF THE DRAWINGS

A better understanding of the invention may be derived from the detailed description following if that description is considered with respect to the attached drawings in which.

DETAILED DESCRIPTION

Figure 1:
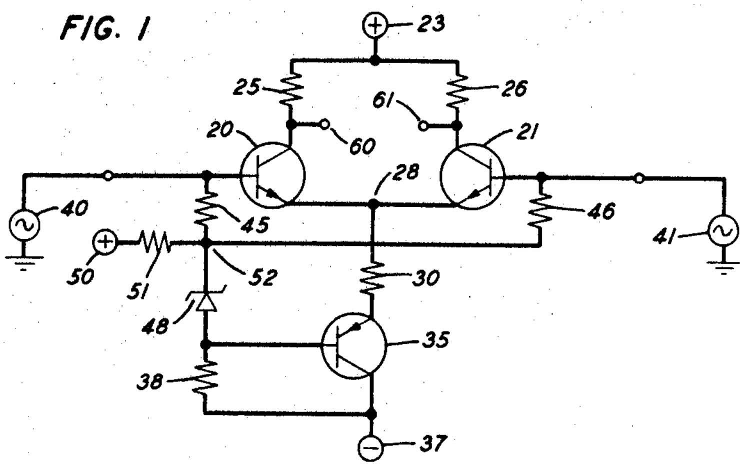
FIG. 1 is a schematic diagram of a differential amplifier in accordance with the invention.

Referring now to FIG. 1, there is shown an emitter-coupled differential amplifier including a matched pair of NPN transistors 20 and 21. Collector supply potential from a grounded positive-potential source 23 is coupled through resistors 25 and 26 respectively to the collector electrodes of the transistors 20 and 21. In the various figures of the specification, potential supplies are shown as a circular symbol enclosing either a positive or a negative polarity designation. The positive or negative symbol indicates that the supply terminal having the same polarity is connected to the point shown and that the supply terminal having opposite polarity is connected to ground. Emitter electrodes of the transistors 20 and 21 are connected together at a common junction 28 in the emitter circuit. Total emitter current for the transistors 20 and 21 is supplied through an emitter resistor 30 which has one terminal connected to the common junction 28.

In the emitter circuit of the differential amplifier, there is shown an emitter-follower amplifier including a PNP transistor 35 which supplies the total emitter current required by the transistors 20 and 21. Collector supply potential from a grounded negative-potential source 37 is applied to the collector electrode of the transistor 35. The resistor 30 couples one port of the emitter-follower, at an emitter electrode of the transistor 35, to the common junction 28 so that the resistor 30 functions as an emitter resistor for both the differential amplifier and the emitter-follower amplifier. A bias resistor 38 couples the collector electrode of the transistor 35 to its base electrode.

Input signals from grounded signal sources 40 and 41 are coupled to both the differential amplifier and the emitter-follower amplifier. Signals from the source 40 are applied through a direct connection to a base electrode of the transistor 20, and signals from the source 41 are applied through a direct connection to a base electrode of the transistor 21. A low impedance coupling circuit including resistors 45 and 46 and a reverse breakdown diode 48 couples input signals from the sources 40 and 41 to another port of the emitter-follower, at the base electrode of the transistor 35. The resistors 45 and 46 are connected in series circuit between the sources 40 and 41. The cathode of the diode 48 is connected to a junction 52 between the resistors 45 and 46, and the anode of the diode 48 is connected to the base electrode of the transistor 35. Diode 48 has a reverse breakdown voltage that is equal to or greater than the sum of the base-emitter junction voltages of the transistors 20 and 35 or 21 and 35 so that the base-emitter junctions of the transistors 20, 21, and 35 are forward biased whenever the diode 48 conducts current in its reverse breakdown conduction mode.

The low impedance of the coupling circuit is achieved by selecting low resistance values for the resistors 45 and 46 and by biasing the diode 48 to continuously conduct in its reverse conduction mode. The resistance of resistors 45 and 46 must be relatively low with respect to the input impedance to the base input circuit of the transistor 35. Bias resistor 38 establishes the bias current for the breakdown diode 48 and the resistors 45 and 46 thereby developing the bias levels for the transistors 20, 21, and 35.

Bias supplies are selected so that the transistors 20, 21, and 35 conduct in the linear region of their characteristics and the diode 48 is continuously conducting in its reverse conduction mode. A grounded positive-potential supply 50 is coupled through a resistor 51 to the junction 52. The bias potential on the base electrode of the transistor 35 is determined by the circuit loop from ground at the source 50 through the resistor 51, the diode 48, and the resistor 38 to the grounded negative-potential source 37.

Output signals from the differential amplifier are produced at terminals 60 and 61 connected respectively to the collector electrodes of the transistors 20 and 21. Output signals have two basic components resulting respectively from differential-mode input signals and common-mode input signals. The differential-mode component of single-ended output signals is determined by measuring the voltage change $\Delta v_o$ between either the terminal 60 or the terminal 61 and ground when a test signal $\Delta v_d/2$ of one polarity is applied by the source 40 and a test signal $\Delta v_d/2$ of opposite polarity is applied by the source 41. An equivalent determination can be made by applying a test signal $\Delta v_d$ between the base electrodes of the transistors 20 and 21. The common-mode component of output signals is determined by measuring the voltage change $\Delta v_o$ between either the terminal 60 or the terminal 61 and ground when two test signals $\Delta v_c$ of equal magnitude and phase are applied simultaneously by the sources 40 and 41.

The gain of the differential amplifier is categorized into difference-mode gain $A_d$ and common-mode gain $A_c$, which are respectively developed from the differential-mode and the common-mode components of output signals.

Difference-mode gain $A_d = \Delta v_o / \Delta v_d$.

Common-mode gain $A_c = \Delta v_o / \Delta v_c$.

The common-mode rejection ratio, C.M.R., is the ratio of the difference-mode gain to the common-mode gain as previously stated.

In operation, the transistors 20 and 21 respond to differential-mode signals in a manner similar to the manner in which a conventional emitter-coupled differential amplifier responds. For differential-mode signals, the signal from the source 40 goes to a potential that is equal in magnitude but opposite in polarity from the potential of the signal from the source 41. These signal changes control differential-mode conduction of the transistors 20 and 21. Whatever change of emitter current occurs in the transistor 20 in response to the differential-mode input signals is equal to but oppositely poled from the change of emitter current conducted by the transistor 21. The changes of emitter current cancel each other at the junction 28 so that total emitter current of the differential amplifier remains constant in response to differential-mode input signals. Since the changes of input signal are equal in magnitude and are oppositely poled, they cancel at the junction 52 in the coupling circuit, and the base electrode of the transistor 35 experiences no change of potential. Conduction through the emitter of the transistor 35 therefore remains constant. The total emitter current required by and supplied to the transistors 20 and 21 therefore remains constant in response to differential-mode input signals in a manner similar to a conventional emitter-coupled differential amplifier. Such a constant total emitter current divides between the transistors 20 and 21 as required to produce differential-mode output signals at terminals 60 and 61, but the constant total emitter current maintains a constant potential on the junction 28.

The voltage transfer ratio $A_e$ to the emitter electrode of each of the transistors 20, 21, and 35 is approximately equal to unity. The voleage transfer ratio to the emitter of each transistor equals the signal voltage from the relevant emitter electrode to ground reference divided by the signal voltage from the relevant base electrode to ground reference. The circuit parameters of FIG. 1 can be selected so that the voltage transfer ratio $A_e$ of each transistor is near unity.

Common-mode input signals from the sources 40 and 41 are equal in magnitude and phase and are applied to the base electrodes of the transistors 20, 21, and 35. As previously mentioned, the sources 40 and 41 are directly connected to the base electrodes of the transistors 20 and 21 so that the common-mode input signals are applied directly to the base electrodes of transistors 20 and 21. The potential on the junction 52 rises or falls an increment that is nearly equal in magnitude to the magnitude of the common-mode input signals because the resistors 45 and 46 have little impedance. As the potential on the junction 52 fluctuates with common-mode input signals, its potential variations are coupled through the low impedance of the conducting diode 48 to the base electrode of the transistor 35. Thus the common-mode input signals are applied to the base electrode of the transistor 35. Since the voltage transfer ratio $A_e$ to each of the emitter electrodes of the transistors 20, 21, and 35 is near unity and common-mode signals are applied to each base electrode, the potential on each of the emitter electrodes follows the common-mode signal. The potential changes on the common junction 28 and on the emitter electrode of transistor 35 are therefore of the same polarity and essentially the same magnitude.

The common-mode component of total emitter current conducted through the resistor 30 in response to common-mode input signals is suppressed to a very small magnitude therefore enhancing the common-mode rejection ratio of the differential amplifier. In accordance with Ohm's law, the common-mode component of total emitter current conducted by the differential amplifier is limited to the change of potential across the resistor 30 divided by the resistance of that resistor. Since the potentials on the juunction 28 and on the emitter electrode of the transistor 35 follow each other with respect to common-mode signals, there is essentially no change of potential across the resistor 30; and therefore essentially no change of total emitter current occurs in response to the common-mode input signals. Such reduced common-mode signals as are not suppressed by operation of transistor 35 are further reduced by another effect. At terminal 60 common-mode output signals are limited to approximately one-half of the common-mode change of total emitter current times the resistance of the resistor 25 because the common-mode component of total emitter current supplied to the differential amplifier divides between the transistors 20 and 21. A similar common-mode output signal occurs at the terminal 61.

Because changes of total emitter current in response to common-mode signals are very small and the potential on each output terminal fluctuates in response to half of the magnitude of those changes, the common-mode signals are substantially suppressed from output signals.

The suppression of common-mode output signals from the current conducted through the resistor 30 is dependent upon how close the voltage transfer ratio $A_e$ of the transistors 20 and 21 matches the voltage transfer ratio of the transistor 35. Suppression of common-mode output signals is therefore improved by matching the voltage transfer ratio $A_{e35}$ (to the emitter electrode of the transistor 35) to the voltage transfer ratios $A_{e20}$ and $A_{e21}$ (respectively to the emitter electrodes of the transistors 20 and 21). By means of adjusting these voltage transfer ratios, the common-mode gain $A_c$ to the output of the differential amplifier can be readily reduced by two or more orders of magnitude with respect to the common-mode gain of the conventional emitter-coupled differential amplifier that uses an emitter-biasing resistor current source.

The broadband common-mode rejection ratio, C.M.R., for input signals to the differential amplifier in FIG. 1 is higher than the C.M.R. of prior art broadband emitter-coupled differential amplifiers. The C.M.R. of differential amplifiers has been defined previously as being equal to the difference mode gain $A_d$ divided by common-mode gain $A_c$. As previously mentioned, the response to differential-mode input signals (difference-mode gain) by the differential amplifier of FIG. 1 is comparable to response of the prior art circuits, and common-mode input signals are suppressed (reduction of common-mode gain) more than they are suppressed by prior art circuits. When these gains are combined in the stated ratio, the C.M.R. is improved, or increased, by two or more orders of magnitude with respect to the C.M.R. of prior art broadband emitter-coupled differential amplifiers.

Because the useful bandwidth of emitter-coupled differential amplifiers is determined in part by the magnitude of the common-mode component of total emitter current, the C.M.R. bandwidth of the circuit shown in FIG. 1 is greater than conventional prior art circuits having a high C.M.R. The common-mode rejection ratio bandwidth of conventional emitter-coupled differential amplifiers that use a transistor collector circuit as a current source can be increased by reducing the high frequency common-mode components of total emitter current. The high frequency components of common-mode current in the conventional circuit are higher because of shunt capacitance from the common junction in the emitter circuit to ground. High frequency components of common-mode current in the embodiment of FIG. 1 are smaller because the shunt capacitance is across the resistor 30. Since, as previously stated, voltage change across the resistor 30 in response to common-mode signals is essentially eliminated, voltage change across the shunt capacitance is also essentially eliminated. Shunt capacitor current is thereby also eliminated.

Therefore the circuit of FIG. 1 suppresses broadband common-mode signals by two orders of magnitude with respect to suppression by conventional broadband emitter-coupled differential amplifiers, and the useful C.M.R. bandwidth of the embodiment of FIG. 1 is greater than the C.M.R. bandwidth of conventional differential amplifiers having a transistor collector circuit as an emitter current source.

Figure 2:
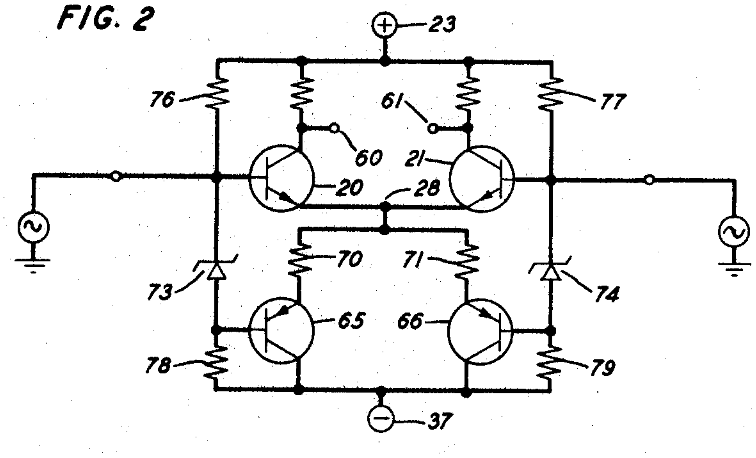
FIG. 2 is a schematic diagram of another embodiment of a differential amplifier in accordance with the invention.

Referring now to FIG. 2, there is shown a schematic diagram of another embodiment of the invention. The differential amplifier including the transistors 20 and 21 remains essentially unchanged except for the emitter-current source and the coupling circuit. In the emitter-current source of FIG. 2, there are two PNP transistors 65 and 66 each arranged in an emitter-follower configuration. A resistor 70 couples an emitter electrode of the transistor 65 to the common junction 28, and a resistor 71 couples an emitter electrode of the transistor 66 to the common junction 28. In the coupling circuit, reverse breakdown diodes 73 and 74 respectively couple base electrodes of the transistors 20 and 21 to base electrodes of the transistors 65 and 66. Diode 73 has a reverse breakdown voltage that is equal to or greater than the sum of the base-emitter junction voltages of the transistors 20 and 65. Diode 74 has a reverse breakdown voltage of similar magnitude taken with respect to the transistors 21 and 66. The resistors 45 and 46 of FIG. 1 are eliminated from the circuit of FIG. 2 to remove the low impedance loading path through the resistors from the source 40 to the source 41.

In FIG. 2 the bias circuits are arranged so that the transistors 20, 21, 65, and 66 conduct in the linear region of their characteristics and the diodes 73 and 74 continuously conduct in their reverse conduction mode. The positive-potential source 23 is resistively coupled to the collector electrodes of the transistors 20 and 21 as in FIG. 1 and is further coupled respectively through resistors 76 and 77 to the base electrodes of the transistors 20 and 21. The negative-potential source 37 is connected to the collector electrodes of the transistors 65 and 66 and is coupled respectively through resistors 78 and 79 to the base electrodes of the transistors 65 and 66.

In operation the embodiment of FIG. 2 functions similar to the embodiment of FIG. 1 except that the low impedance loading path through the resistors 45 and 46 between the input sources has been eliminated, and each of the transistors 65 and 66 supplies approximately one-half of the total emitter current for the transistors 20 and 21. In the embodiment of FIG. 1, this total emitter curren is supplied entirely by the transistor 35.

In FIG. 2 the input signals are applied directly and separately to the base electrodes of the transistors 20 and 21 and are applied indirectly and separately through the diodes 73 and 74 respectively to the base electrodes of the transistors 65 and 66. Each of the transistors 20, 21, 65, and 66 is matched for approximately the same voltage transfer ratio to its emitter electrode.

In FIG. 2 as in FIG. 1, response to differential-mode signals is essentially the same as the response of a conventional emitter-coupled differential amplifier, but the transistors 65 and 66 respectively conduct the emitter currents required by the transistors 20 and 21. Any tendency of the potential dlifference to fluctuate across either of the resistors 70 or 71 is suppressed in a manner that is similar to suppression of the change of potential difference across the resistor 30 of FIG. 1, that is, the potentials on opposite terminals of the resistors 70 and 71 follow one another. The potentials on opposite terminals of the resistors have essentially the same magnitude and phase with respect to ground at all times. Thus by Ohm's law there is little change of total emitter current in response to common-mode input signals and such signals are significantly suppressed at the output terminals 60 and 61. The suppression of common-mode signals substantially improves the C.M.R. and C.M.R. bandwidth with respect to conventional emitter-coupled differential amplifiers.

Figure 3:
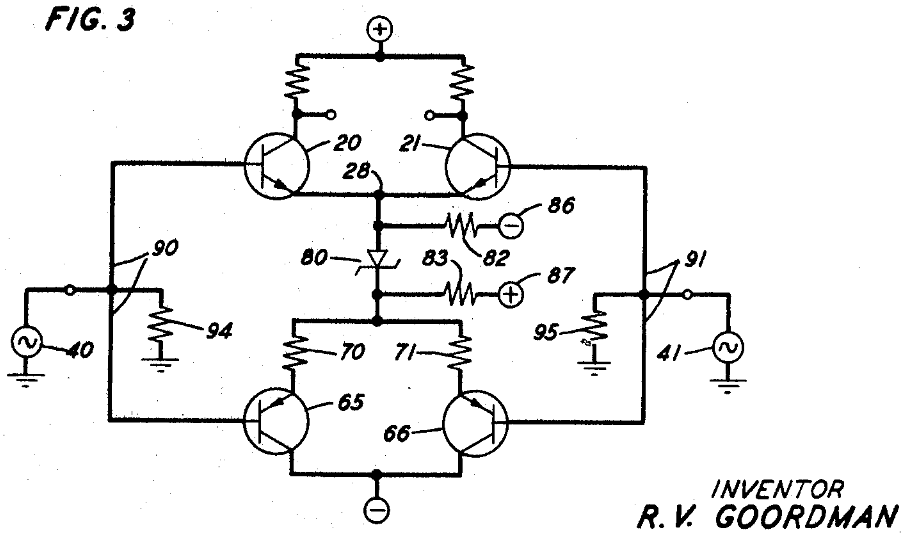
FIG. 3 is a schematic diagram of a further embodiment of a differential amplifier in accordance with the invention.

Referring now to FIG. 3 there is shown a schematic diagram of a further embodiment of the invention. The combination of the differential amplifier and the emitter-follower amplifiers, including the transistors 20, 21, 65, and 66, is essentially the same as the embodiment of FIG. 2 except that the embodiment of FIG. 3 has bias voltage provided by means of a single reverse breakdown diode 80 which is inserted in the emitter circuit between the emitter followers and the differential amplifier as a replacement for the two reverse breakdown diodes 73 and 74 shown in FIG. 2. Resistors 82 and 83 respectively couple a grounded negative-potential source 86 to an anode of the diode 80 and a grounded positive-potential source 87 to a cathode of the diode 80. The resistors 70 and 71 respectively couple the emitter electrodes of the transistors 65 and 66 to the cathode of the diode 80 which is arranged to be continuously conducting in its reverse conduction mode. The anode of the diode 80 is connected to the junction 28. Thus the emitter electrodes of the transistors 65 and 66 are respectively coupled through the resistors 70 and 71 and a low impedance of the diode 80 to the junction 28. The diode 80 is selected to have a reverse breakdown voltage equal to or greater than the sum of the base-emitter junction voltages of the transistors 20 and 65. The reverse breakdown voltage of the diode 80 must also be equal to or greater than the sum of the base-emitter junction voltages of the transistors 21 and 66. The source 40 is connected through a lead 90 directly to the base electrodes of both transistors 20 and 65, and the source 41 is similarly connected by a lead 91 directly to the base electrodes of both transistors 21 and 66. Bias circuit resistors 76, 77, 78, and 79 shown in FIG. 2 are omitted from the embodiment of FIG. 3 because biasing is accomplished in the emitter circuit.

The embodiment of FIG. 3 responds to differential-mode input signals and to common-mode input signals in a manner that is similar to the response of the embodiment of FIG. 2. As in the circuit of FIG. 2, the potential on the junction 28 remains constant in response to differential-mode signals and follows the potential on the emitter electrodes of the transistors 65 and 66 in response to common-mode signals. Any fluctuation of potential on the junction 28 caused by common-mode input signal variation is coupled through the low impedance of the conducting diode 80 to the junction between the resistors 70 and 71. The potentials on opposite ends of the resistors 70 and 71 essentially follow one another and thereby suppress common-mode signals to improve the C.M.R. and increase C.M.R. bandwidth with respect to conventional emitter-coupled differential amplifiers.

It should be noted that one less reverse breakdown diode is required in the embodiment of FIG. 3 than in the embodiment of FIG. 2. Additionally, for particular circuit applications, the circuit designer may alter the emitter circuit resistance combination of FIG. 3 by inserting a resistor in series circuit with the diode 80 either in place of or in addition to the resistors 70 and 71 shown in FIG. 3.

Figure 4:
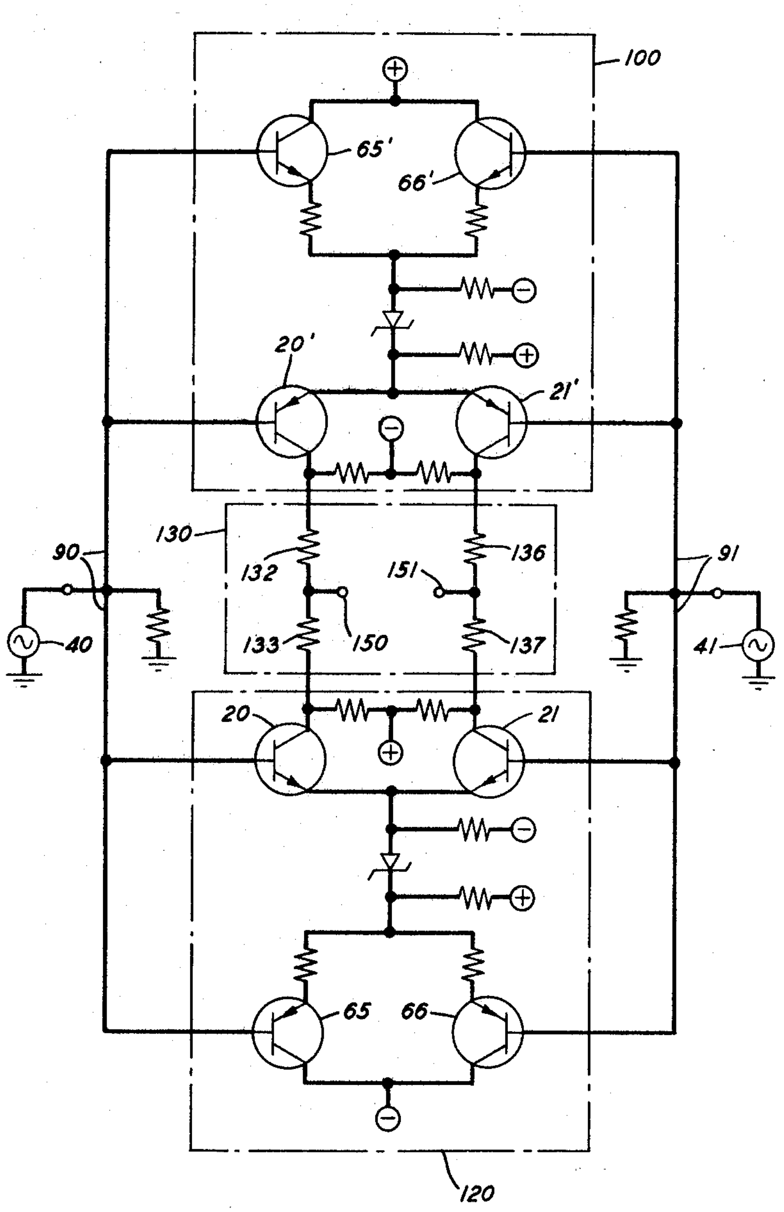
FIG. 4 is a schematic diagram of a differential bridge amplifier including two differential amplifier stages arranged in accordance with the invention.

Referring now to FIG. 4 there is shown a differential bridge amplifier including stages 100 and 120 that are arranged in configurations similar to the embodiment of FIG. 3. The stage 120 is a duplicate of the embodiment of FIG. 3, and the stage 100 is essentially a duplicate except that transistors 20′, 21′, 65′, and 66′ in stage 100 are of complementary conductivity types with respect to the transistors of FIG. 3 and that voltage supply polarities are correspondingly interchanged. Transistors 20, 21, 20′, and 21′ are selected to have matching parameters and are thermally coupled in any manner known in the art so that the ambient temperature of all of the transistors 20, 21, 20′, and 21′ is the same.

A coupling circuit 130 including voltage dropping resistors 132, 133, 136, and 137 is arranged in a bridge configuration which couples the output terminals of the stage 100 to the output terminals of the stage 120. The resistors 132 and 133, arranged in series circuit, couple the collector electrode of the transistor 20′ to the collector electrode of the transistor 20. The resistors 136 and 137, also arranged in series circuit, couple the collector electrode of the transistor 21′ to the collector electrode of the transistor 21. An intermediate junction between the resistors 132 and 133 and an intermediate junction between the resistors 136 and 137 are connected respectively to output terminals 150 and 151 from which differential-mode output signals are produced.

Input signals are applied either between ground reference and the base electrodes of the transistors in each of the stages 100 and 120 or simply between the leads 90 and 91. The signal source 40 is connected by way of the lead 90 to the base electrodes of the transistors 20 and 65 of stage 120 and to the base electrodes of the transistors 20′ and 65′ of the stage 100. The signal source 41 is connected by way of the lead 91 to the base electrodes of the transistors 21 and 66 of the stage 120 and to the base electrodes of the transistors 21′ and 66′ of the stage 100.

The stages 100 and 120 are effectively connected in parallel with respect to diffrential-mode input signals. In response to such differential-mode input signals, differential-mode output signals and difference-mode gain have magnitudes that are approximately twice the magnitude of corresponding quantities for the differential-mode output of a single differential amplifier stage such as the embodiment of FIG. 3 because the bridge arrangement effectively connects the stages 100 and 120 in parallel.

Temperature-induced common-mode signals are substantially suppressed in the differential bridge amplifier of FIG. 4. Because the transistors of the two stages are of complementary transistor types, because the transistors have matching parameters, and because they are thermally coupled, temperature-induced changes of base-emitter junction voltage $V_{BE}$ and of base input current $I_B$ balance, or offset, one another between the stages 100 and 120.

Now considering that the difference-mode gain is enhanced by a factor that is approximately equal to 2 as previously stated, considering that the temperature-induced common-mode changes balance between the stages 100 and 120 as previously stated, and considering that the common-mode signals from the sources 40 and 41 are substantially suppressed by the stages 100 and 120 in a manner described in reference to the embodiment of FIG. 3, the common-mode rejection ratio for the differential bridge amplifier is substantially improved relative to conventional prior art emitter-coupled differential amplifiers. The improvement in the C.M.R. results because of suppression of both the common-mode input signals and any ambient temperature-induced changes of signals.

The above detailed description is illustrative of several embodiments of the invention, and it is to be understood that additional embodiments thereof will be obvious to those skilled in the art. The embodiments described herein together with those additional embodiments are considered to be within the scope of the invention.

What is claimed is:

1. An amplifier comprising
- first and second transistors,
- first means coupling an emitter electrode of the first transistor to an emitter electrode of the second transistor,
- a third transistor,
- a first resistive means electrically coupling an emitter electrode of the third transistor to the first coupling means, and
- a first input means electrically coupling a base electrode of the first transistor to a base electrode of the third transistor.

2. An amplifier in accordance with claim 1 in which the first and second transistors are of a first conductivity type and the third transistor is of a second conductivity type.

3. An amplifier in accordance with claim 1 in which the first input means further electrically couples a base electrode of the seocnd transistor to the base electrode of the third transistor.

4. An amplifier in accordance with claim 1 further comprising
- a fourth transistor,
- a second input means coupling a base electrode of the second transistor to a base electrode of the fourth transistor, and
- the first resistive means further electrically couples an emitter electrode of the fourth transistor to the first coupling means.

5. An amplifier in accordance with claim 4 further comprising
- biasing means interposed in series circuit with the resistive means in between the emitter electrode of the third transistor and the first coupling means.

6. An amplifier in accordance with claim 2 further comprising
- fifth and sixth transistors of the second conductivity type,
- second means coupling an emitter electrode of the fifth transistor to an emitter electrode of the sixth transistor,
- a seventh transistor of the first conductivity type,
- a second resistive means electrically coupling an emitter electrode of the seventh transistor to the second coupling means,
- the first input means further electrically coupling the base electrodes of the first and third transistors to base electrodes of the fifth and seventh transistors,
- a first voltage dropping means coupling current from a collector electrode of the first transistor to a collector electrode of the fifth transistor, and
- a second voltage dropping means coupling current from a collector electrode of the second transistor to a collector electrode of the sixth transistor.

7. An amplifier comprising
- first and second emitter-coupled differential amplifiers, said first amplifier including first conductivity type transistors and said second amplifier including second conductivity type transistors,
- a first voltage dropping means coupling a first output terminal of the first differential amplifier to a first output terminal of the second differential amplifier,
- a second voltage dropping means coupling a second output terminal of the first differential amplifier to a second output terminal of the second differential amplifier,
- a first transistor of the second conductivity type,
- a first resistive means coupling an emitter electrode of the first transistor to a junction in the emitter circuit of the first differential amplifier,
- a second transistor of the first conductivity type,
- a second resistive means coupling an emitter electrode of the second transistor to a junction in the emitter circuit of the second differential amplifier,
- and means connecting a first input terminal of both the first and second differential amplifiers in common to base electrodes of the first and second transistors.

8. An amplifier in accordance with claim 7 further comprising
- a third transistor,
- the first resistive means further coupling an emitter electrode of the third transistor to the junction in the emitter circuit of the first differential amplifier,
- a fourth transistor,
- the second resistive means further coupling an emitter electrode of the fourth transistor to the junction in the emitter circuit of the second differential amplifier,
- and means connecting a second input terminal of both the first and the second differential amplifiers in common to base electrodes of the third and fourth transistors.

9. An amplifier comprising
- first and second continuously conducting transistors of a first conductivity type,
- first means coupling an emitter electrode of the first transistor to an emitter electrode of the second transistor,
- means connected to said first coupling means for providing conducting paths for total emitter current of the first and second transistors, the conducting paths comprising
  - a third continuously conducting transistor of a second conductivity type,
  - second means coupling common-mode input signals from a base electrode of the first transistor to a base electrode of the third transistor,
  - a fourth continuously conducting transistor of the second conductivity type,
  - third means exclusive of the second coupling means for coupling common-mode signals from a base electrode of the second transistor to a base electrode of the fourth transistor,
  - and fourth means coupling the emitter electrodes of the third and fourth transistors to the first coupling means.

10. An amplifier comprising
- an emitter-coupled differential amplifier including a pair of substantially matched transistors of a first conductivity type and having a common emitter junction,
- an emitter-follower amplifier included in the differential amplifier and having a second conductivity type transistor,
- impedance means coupling electrical signal variations between a pair of first input terminals to the differential amplifier,
- a diode coupling electrical signal variations from the impedance means to a base electrode of the second conductivity type transistor, and resistive means included in the differential amplifier coupling together for common signal current conduction the differential amplifier junction and an emitter-collector path through the second conductivity type transistor.

11. An amplifier comprising an emitter-coupled differential amplifier including a pair of transistors, a pair of first input terminals for receiving common-mode and differential-mode signals, and an emitter circuit junction, an emitter-follower amplifier including a third transistor, a second terminal connected to a base electrode of the third transistor, and a third terminal connected to an emitter electrode of the third transistor, impedance means exclusive of the differential amplifier coupling together the pair of first input terminals and transferring common-mode signals exclusive of the differential-mode signals to an intermediate terminal of the impedance means, a reverse breakdown diode coupling the common-mode signals from the intermediate terminal of the impedance means to the second terminal, the diode conducting in its reverse conduction mode and providing bias to continuously operate the three transistors in their linear ranges, and means coupling the third terminal to the emitter circuit junction.

12. An amplifier comprising an emitter-coupled differential amplifier having inputs for receiving common-mode signals, said amplifier producing at a common emitter junction potential changes substantially following common-mode signals applied to its inputs, an emitter-follower amplifier producing on an emitter electrode potential changes substantially following signals applied to its base electrode, impedance means coupling the emitter electrode to the common emitter junction, and means exclusive of the differential amplifier concurrently coupling said common-mode signals from the differential amplifier inputs to the base electrode of the emitter-follower amplifier.

References Cited

UNITED STATES PATENTS

| | | | |
|---|---|---|---|
| 3,225,209 | 12/1965 | Schuster | 330—15 X |
| 3,262,066 | 7/1966 | Trilling | 330—30 X |
| 3,275,945 | 9/1966 | Walker et al. | 330—69 X |
| 3,395,358 | 7/1968 | Petersen | 330—30 X |

ROY LAKE, Primary Examiner

L. J. DAHL, Assistant Examiner